(12) United States Patent
Choy et al.

(10) Patent No.: US 11,158,669 B2
(45) Date of Patent: Oct. 26, 2021

(54) ULTRA-DENSE ARRAY OF LEDS WITH HALF CAVITIES AND REFLECTIVE SIDEWALLS, AND MANUFACTURING METHODS

(71) Applicant: Tectus Corporation, Saratoga, CA (US)

(72) Inventors: Kwong-Hin Henry Choy, San Jose, CA (US); Ewelina Natalia Lucow, Los Gatos, CA (US); Paul Scott Martin, Palo Alto, CA (US)

(73) Assignee: Tectus Corporation, Saratoga, CA (US)

( * ) Notice: Subject to any disclaimer, the term of this patent is extended or adjusted under 35 U.S.C. 154(b) by 0 days.

(21) Appl. No.: 16/695,046

(22) Filed: Nov. 25, 2019

(65) Prior Publication Data
US 2021/0159267 A1    May 27, 2021

Related U.S. Application Data

(63) Continuation of application No. 16/692,767, filed on Nov. 22, 2019.

(51) Int. Cl.
*H01L 27/15* (2006.01)
*H01L 33/10* (2010.01)
(Continued)

(52) U.S. Cl.
CPC ........ *H01L 27/156* (2013.01); *H01L 33/0075* (2013.01); *H01L 33/06* (2013.01);
(Continued)

(58) Field of Classification Search
CPC ... H01L 27/156; H01L 33/0075; H01L 33/62; H01L 33/06; H01L 2933/0025; H01L 2933/0066; G02C 7/04
See application file for complete search history.

(56) References Cited

U.S. PATENT DOCUMENTS 5,717,251 A * 2/1998 Hayashi ............... G03F 7/095
                                                  257/386
7,518,149 B2    4/2009 Maaskant
(Continued)

OTHER PUBLICATIONS

Chance, et al., "Fluorescence and energy transfer near interfaces: The complete and quantitative description of the Eu+3/mirror systems," The Journal of Chemical Physics, vol. 63, No. 4, 1589-1595 (Aug. 15, 1975).
(Continued)

*Primary Examiner* — Feifei Yeung Lopez
(74) *Attorney, Agent, or Firm* — Fenwick & West LLP

(57) ABSTRACT

In one approach, an LED array uses a combination of a half cavity and straight reflective sidewalls to improve the power distribution so that more light falls within the collection angle of the projection optics. From the bottom upwards, the LEDs in the array include a reflector, a thinner p-layer and a thicker n-layer. An active region (such as quantum wells) between the p-layer and the p-layer generates light. Without additional structures, the generated light would have an isotropic distribution and not much of the light would fall within the collection angle of the projection optics. However, the bottom reflector and p-layer form a half cavity for the light emitted from the active region. This alters the angular power distribution. Straight reflective sidewalls extending from the active region upwards into the n-layer further reflect light from the altered power distribution into the collection angle of the projection optics.

20 Claims, 20 Drawing Sheets

(51) Int. Cl.
*H01L 33/08* (2010.01)
*H01L 33/38* (2010.01)
*H01L 33/06* (2010.01)
*H01L 33/00* (2010.01)
*H01L 33/46* (2010.01)
*H01L 33/62* (2010.01)
*G02C 7/04* (2006.01)

(52) U.S. Cl.
CPC ............ *H01L 33/08* (2013.01); *H01L 33/105* (2013.01); *H01L 33/38* (2013.01); *H01L 33/46* (2013.01); *H01L 33/62* (2013.01); *G02C 7/04* (2013.01); *H01L 2933/0025* (2013.01); *H01L 2933/0066* (2013.01)

(56) References Cited

U.S. PATENT DOCUMENTS

| | | | |
|---|---|---|---|
| 9,106,056 B1 | 8/2015 | Hersee | |
| 2002/0023389 A1* | 2/2002 | Minamihaba | C09G 1/02 |
| | | | 51/308 |
| 2002/0163007 A1* | 11/2002 | Matsumoto | H01L 33/145 |
| | | | 257/94 |
| 2003/0025208 A1* | 2/2003 | Makiyama | H01L 29/517 |
| | | | 257/773 |
| 2005/0194169 A1* | 9/2005 | Tonomura | H01L 23/50 |
| | | | 174/392 |
| 2006/0284187 A1* | 12/2006 | Wierer, Jr. | G02B 6/1225 |
| | | | 257/79 |
| 2009/0026480 A1* | 1/2009 | Hayashi | H01L 33/62 |
| | | | 257/98 |
| 2011/0266568 A1* | 11/2011 | Aldaz | H01L 33/46 |
| | | | 257/98 |
| 2012/0119237 A1 | 5/2012 | Leatherdale | |
| 2012/0256187 A1* | 10/2012 | Yu | H01L 27/153 |
| | | | 257/76 |
| 2017/0141279 A1* | 5/2017 | Do | H01L 33/0075 |
| 2018/0166424 A1* | 6/2018 | Sim | H01L 33/483 |

OTHER PUBLICATIONS

Choi, et al., "Numerical Investigation of Purcell Enhancement of the Internal Quantum Efficiency of GaN-based Green LED Structures," Current Optics and Photonics, vol. 1, No. 6, Dec. 2017, 626-630.
Shen, et al., "Optical cavity effects in InGaN/GaN quantum-well-heterostructure flip-chip light-emitting diodes," Applied Physics Letters, vol. 82, No. 14, 2221-2223 (Apr. 7, 2003).
Steigerwald, et al., "Illumination With Solid State Lighting Technology," IEEE Journal on Selected Topics in Quantum Electronics, vol. 8, No. 2, Mar./Apr. 2002, 310-320.
Tuttle, "Design Considerations with LED Package Primary Optics," Cree, 2017 DOE SSL R&D Workshop, Feb. 2, 2017, 21 pages.

* cited by examiner

Cross-sectional View

Top View

ULTRA-DENSE ARRAY OF LEDS WITH HALF CAVITIES AND REFLECTIVE SIDEWALLS, AND MANUFACTURING METHODS

CROSS REFERENCE TO RELATED APPLICATIONS

This application is a continuation of U.S. application Ser. No. 16/692,767, "Ultra-dense Array of LEDs with Half Cavities and Reflective Sidewalls," filed Nov. 22, 2019, now Pat. No. 11,127,881, which is incorporated by reference in its entirety.

BACKGROUND

1. Technical Field

This disclosure relates generally to light emitting diode (LED) arrays and, more specifically, to ultra-dense LED arrays, such as for use in a contact lens.

2. Description of Related Art

A "femtoprojector" is a small projector that projects images from an image source contained inside a contact lens onto a user's retina. The image source and associated optical system are small enough to fit inside a contact lens. To meet this size requirement while still achieving reasonable resolution, the pixel sizes in the image source typically are much smaller than in image sources for other applications. For example, a conventional LED direct emission display uses discrete red, green, and blue emitting LEDs with resolutions of up to 500 pixels per inch (composite white pixels/inch) and about a 25 um (micron) pitch from one colored pixel to the neighboring color pixel. In contrast, an LED array for a femtoprojector preferably has pixel sizes of less than 1 um$^2$ in emitting area with a pixel pitch of 2 um or less.

One important metric for an LED array is the extraction efficiency. This is the efficiency with which light generated by the LEDs is coupled into the rest of the optical system. This can be challenging when the projection optics has a small collection angle, as may be the case for projection optics that fit in a contact lens. In addition, light which is not imaged by the projection optics is effectively stray light. Stray light may be reduced and/or redirected through good design of the optical system, but this can also be challenging for such small optical systems.

Accordingly, what is needed are better approaches to forming an ultra-dense (and, therefore, correspondingly higher resolution) LED array, with higher extraction efficiency and better control of stray light.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

Figure 1:
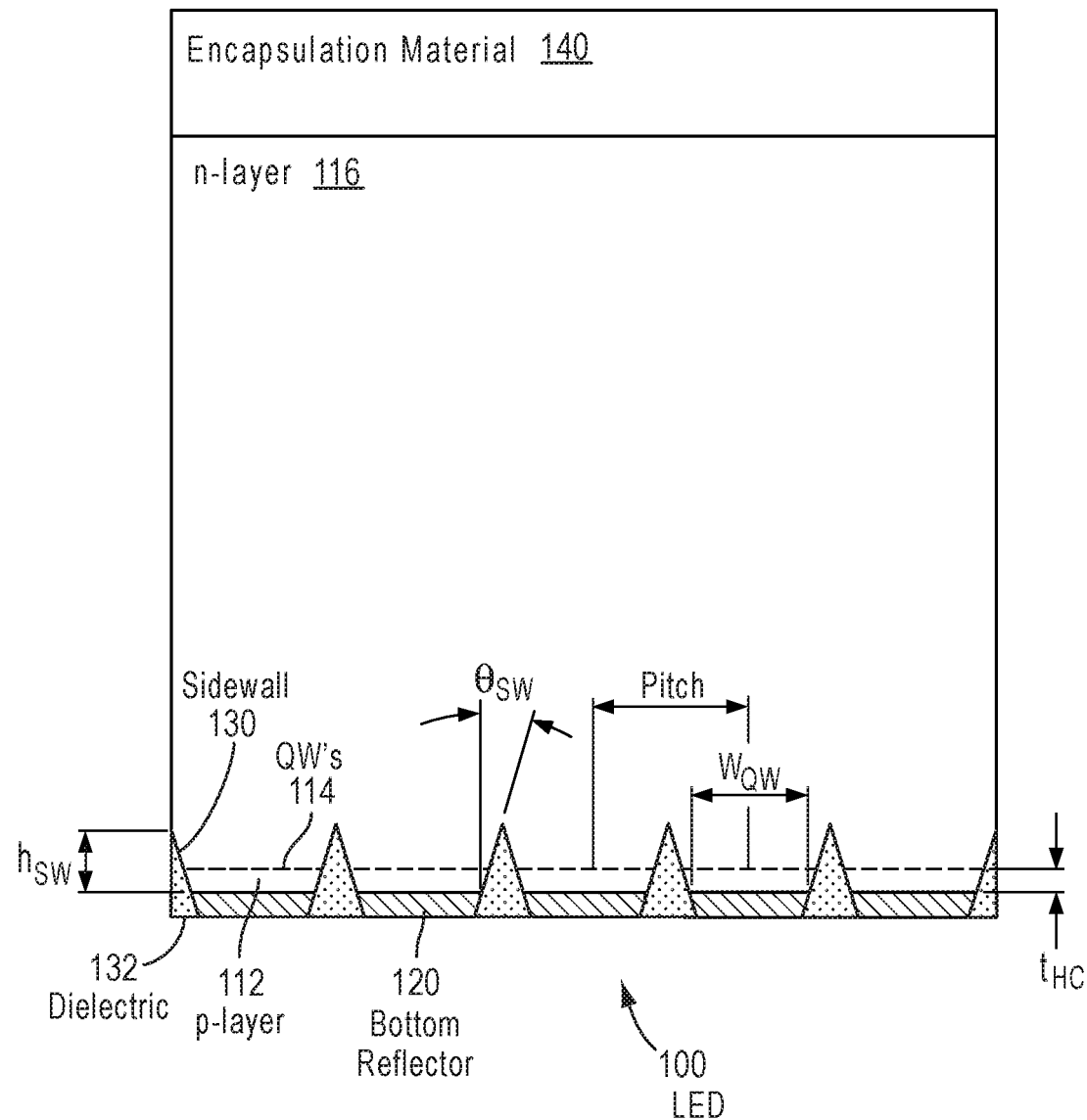
FIG. 1 is a cross-sectional diagram of an LED array.

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

In one approach, an LED array uses a combination of a half cavity and sloped, straight reflective sidewalls to improve the power distribution so that more light falls within the collection angle of the projection optics. From the "bottom" upwards, the LEDs in the array include a reflector, a thinner p-layer and a thicker n-layer. In the context of describing the device structure, "bottom" or "down" is the direction opposite the direction of light emission and "top" or "up" is in the direction of light emission. An active region (such as a quantum well region) between the n-layer and the p-layer generates light. Without additional structures, the generated light would have an isotropic distribution and not much of the light would fall within the collection angle of the projection optics. However, the bottom reflector and p-layer form a half cavity for the light emitted from the active region. This alters the angular power distribution. Straight reflective sidewalls extending at an angle from the active region upwards into the p-layer further reflect light from the altered power distribution into the collection angle of the projection optics.

In one approach, the half cavity creates an angular power distribution with one or more lobes, each of which produces maximum power along some angle from normal. For example, the first lobe may produce maximum power at an angle of 35° relative to normal and the second lobe may produce maximum power at an angle of 74°. The sidewalls may be tilted with a sidewall angle of 17.5°, which reflects the first lobe to the normal direction (0° angle). The sidewalls may be constructed so that the first lobe is reflected due to total internal reflection but the second lobe passes through the sidewall and is absorbed, thus reducing stray light.

Another aspect concerns the fabrication of such devices. The p-layer, quantum wells, and unintentionally doped n-layer may be about 0.7 um in total, and the total height of the LED stack may be significantly taller than 0.7 um if additional layers are added. On the other hand, LED arrays used in contact lenses may have pitches on the order of 2 um or less, and individual structures within each pixel may be a fraction of the 2 um pitch. This results in individual structures with high aspect ratios, which are more challenging to fabricate.

In one fabrication approach, a semiconductor stack is epitaxially grown. From the "bottom" up, the stack includes the thicker n-layer, the active region (e.g., quantum well), the thinner p-layer and a reflector layer. (Note that bottom and top are reversed relative to the previous paragraphs. In the context of describing device fabrication, the device is fabricated starting from the "bottom" and moving "upwards".) An array of trenches is etched through all the layers into the thicker n-layer. The trenches isolate the individual LEDs and the sides of the trenches form the sidewalls of the LEDs. The trenches are at least partially filled with a dielectric. This structure is planarized (e.g., using chemical mechanical polishing), creating a top surface comprising the reflector layer for each LED and the planarized dielectric between LEDs. Metal contacts to the reflector layer are formed on this flat top surface, for example by a liftoff process.

FIGS. 1-11 show different designs of LED arrays. FIGS. 12-14 show different fabrication processes. These examples use a thinner p-layer grown on a thicker n-layer. However, the p- and n-layers may be reversed (i.e., thinner n-layer on thicker p-layer). In FIGS. 1-11, the directions "top" "bottom" "up" "down" etc. are from a display perspective where light is emitted upwards. In FIGS. 12-14, the directions are reversed because they are taken from a manufacturing perspective where the base substrate is on the bottom. Thus, in FIGS. 1-11 the thinner p-layer is below the thicker n-layer, but in FIGS. 12-14 the thinner p-layer is above the thicker n-layer.

FIG. 1 is a cross-sectional diagram of an array of LEDs 100. Each LED 100 includes a semiconductor stack with a bottom p-layer 112, active region 114, and top n-layer 116. The active region 114 may be a quantum well region. Other gain media include heterostructures and quantum dot layers. The LEDs 100 also include a bottom reflector 120 located below the bottom layer 112. The bottom reflector 120 and bottom layer 112 form a half cavity for light emitted from the active region 114, as will be described in more detail in FIG. 2. The LED array also has angled reflective sidewalls 130. The sidewalls are "straight," meaning that in cross-section they appear as lines. Their three-dimensional shape may be flat (e.g., a face of a pyramid) or conical. In this example, the sidewalls 130 are constructed as a trench filled by a dielectric 132. The sidewalls 130 are reflective due to total internal reflection at the interface between the dielectric 132 and the semiconductor stack. Here, they extend through the bottom reflector and through the semiconductor stack into the top layer. The array also includes a top encapsulation material 140.

The half cavity formed by bottom layer 112 and bottom reflector 120, and the angled sidewalls 130 together redistribute the light emitted from the active region so that more of it couples into the projection optics (not shown in FIG. 1). The set of rays collected by the projection optics will be referred to as the collection angle or collection cone of the projection optics, even though strictly speaking the set of rays may not span a cone. In one approach, the half cavity 112/120 concentrates the light from the active region into lobe(s), and the sidewalls 130 reflect the lobe(s) to the direction normal to the semiconductor stack.

FIG. 1 is labelled with parameters for the LED array. "Pitch" is the pitch between adjacent LEDs in the array. $\theta_{SW}$ is the slope angle of the sidewalls, measured from the normal direction, so $\theta_{SW}=0°$ would be a vertical sidewall. $h_{SW}$ is the height or thickness of the sidewalls, measured from the top of the bottom reflector. $t_{HC}$ is the height or thickness of the half cavity. $w_{QW}$ is the width of the active region 114.

FIG. 1 is drawn to scale for a GaN (gallium nitride) LED array with pitch=1.3 um. The sidewalls 130 have sidewall angle $\theta_{SW}=15°$ and are $h_{SW}=0.7$ um tall. In this example, the p-layer 112 is 0.17 um thick ($t_{HC}=0.17$ um), creating a half cavity that is 0.78 wavelengths. The p-layer 116 is 5.5 um thick.

Other designs will use other dimensions. For example, the pitch may be in a range of 0.5 um to 2.0 um, with active regions having a width of 40% to 90% of the pitch. Such small pitches will result in high aspect ratio structures. For example, the sidewalls may have heights in a range of 0.7 um to 1.5 um.

Figure 2:
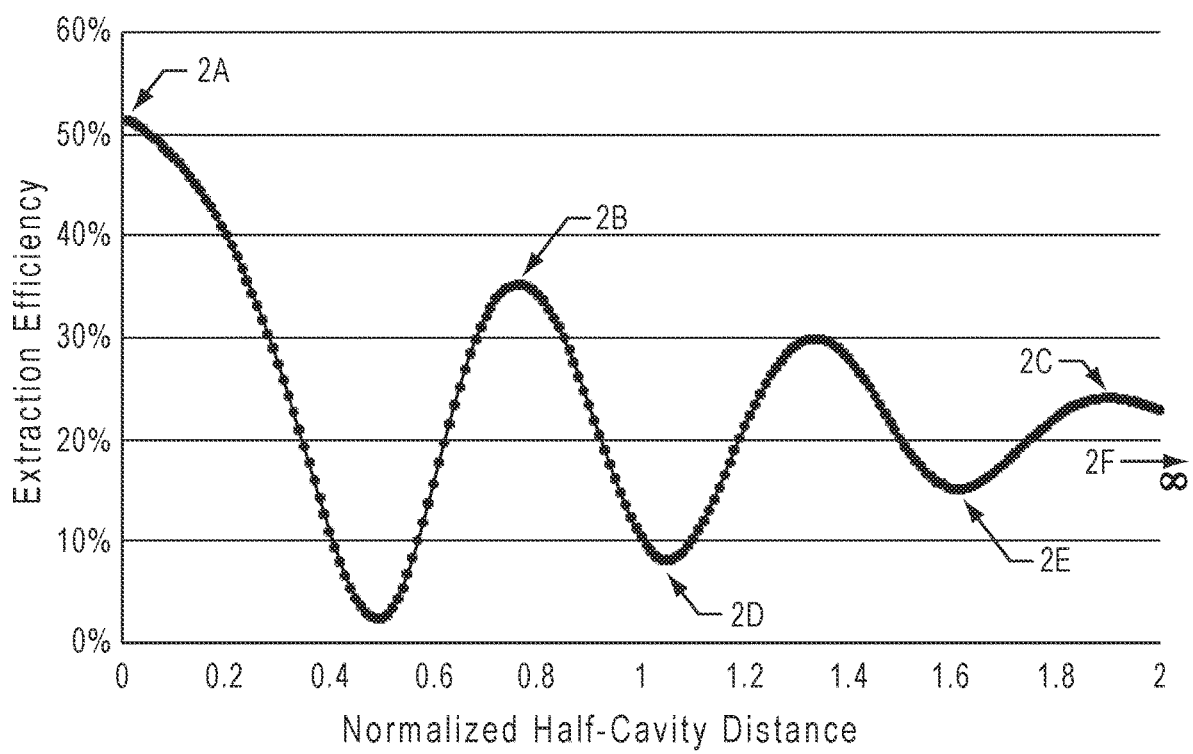
FIG. 2 is a plot of extraction efficiency as a function of half-cavity thickness.

FIG. 2 shows the effect of the half cavity. In the half-cavity effect, the upward emitted light from the active region 114 interferes with downward emitted light that is reflected from the bottom reflector 120. As a result, the power distribution of the light is redistributed from an isotropic distribution to some other distribution, depending on whether the waves propagating along a particular direction are constructively or destructively interfering. If the semiconductor 116 has a higher refractive index than the top encapsulating material 140, then the interface between these two materials 116, 140 defines a critical angle, $\theta_c$. Light incident at angles that are more oblique than the critical angle will be totally internally reflected at the interface.

FIG. 2 is a plot of extraction efficiency as a function of half-cavity thickness. The half-cavity thickness ($t_{HC}$) is normalized by the wavelength in the medium. In this example, the refractive indices of the semiconductor 116 and the encapsulating material 140 are 2.4 and 1.6, respectively, which yields a ratio of 2.4/1.6=1.5 and a critical angle $\theta_c$ of slightly more than 40 degrees. Other materials may be used. The ratio of refractive indices may be greater than 1.2. The extraction efficiency in FIG. 2 is defined as the percentage of emitted light that falls within the critical angle, assuming that the structures are all infinite in lateral extent (i.e., effects of pixelation and sidewalls are ignored). The plot has maxima at approximately 0.00λ, 0.78λ, 1.34λ, etc.

Figure 2A:
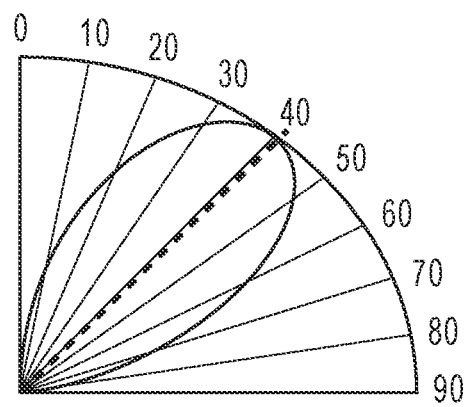
FIGS. 2A-2F are plots of angular power distributions at different points along the graph of FIG. 2.
Figure 2B:
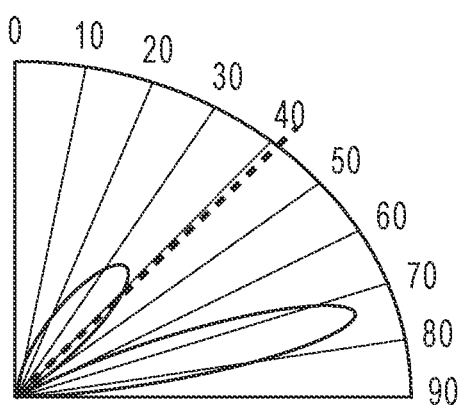
Figure 2C:
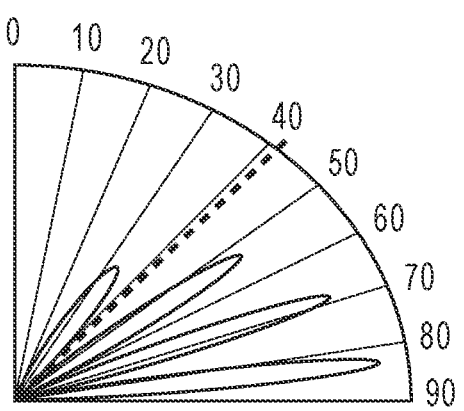
Figure 2D:
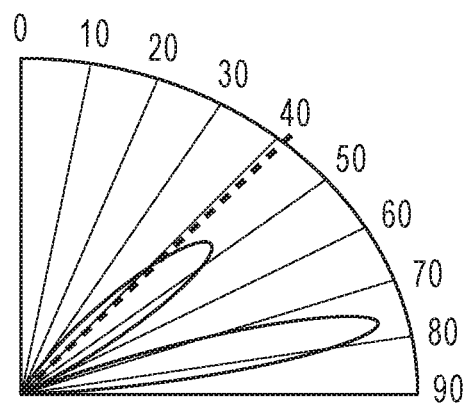
Figure 2E:
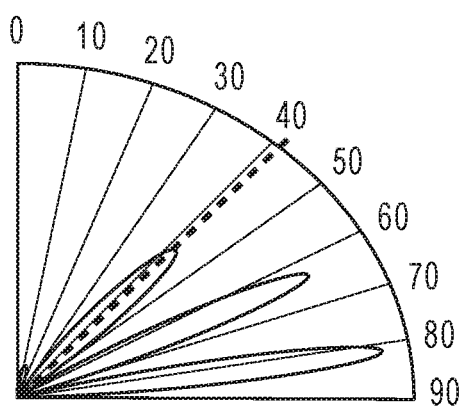
Figure 2F:
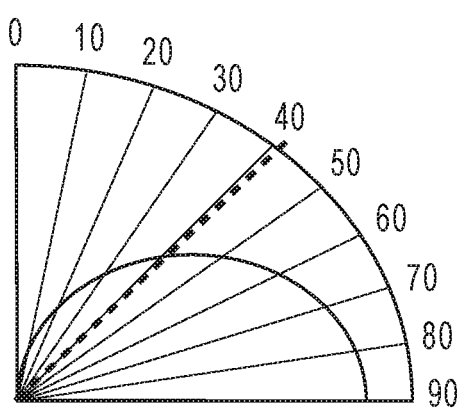

FIGS. 2A-2F are plots of angular power distributions at different points along the plot of FIG. 2. The plots show the relative amount of power emitted at each angle, where the power is integrated over the azimuthal direction. Thus, the light along the normal direction (0 degrees) may have the strongest intensity (power per area), but it does not span a large solid angle, so after integrating over the azimuth, the total power along the normal direction is not high. FIG. 2A shows the angular power distribution at point 2A of FIG. 2 (the maximum at 0.00λ), FIG. 2B shows the angular power distribution at point 2B (the maximum at 0.78λ), and so on. FIGS. 2A, 2B and 2C show three of the maxima. FIGS. 2D and 2E show two of the minima. FIG. 2F shows the asymptotic case where the half cavity has an infinite thickness. This is equivalent to a situation with no bottom reflector (i.e., isotropic distribution). The calculations account only for interference and do not include effects such as the Purcell effect or plasmonic effects.

For each of the maxima and minima (FIGS. 2A-2E), the half cavity redistributes light emitted from the active region into an angular power distribution with one or more lobes. FIG. 2A shows a single lobe with angle of maximum power at approximately 40 degrees, FIG. 2B shows two lobes with maximum power at approximately 35° and 74°, etc. The critical angle is marked by the dashed line. In the angular power distributions for the maxima in FIGS. 2A-2C, the first lobe (i.e., lobe closest to normal) falls within the critical angle. For the minima in FIGS. 2D-2E, none of the lobes of the angular power distribution fall mostly within the critical angle.

As shown in FIG. 2, when the quantum wells are positioned sufficiently close to the bottom reflectors, the emission pattern changes to a distribution with individual lobes. The difference is more pronounced when there are only a few lobes, for example one or two lobes. The sidewall is used to redirect the lobe(s) so that they fall within the collection angle of the projection optics.

Figure 3:
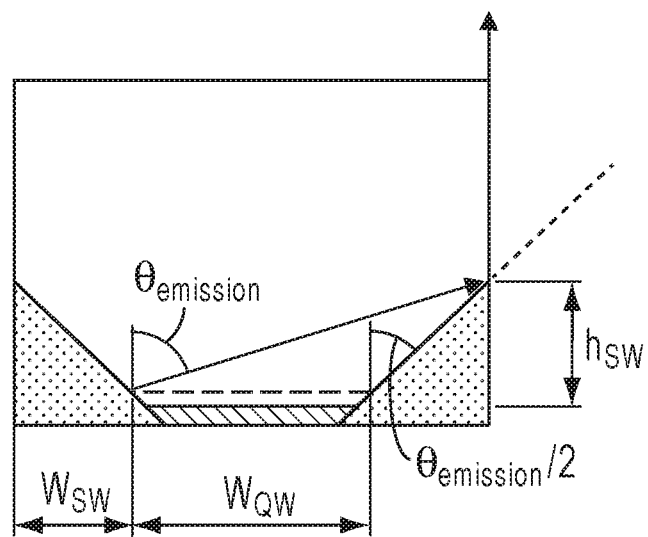
FIG. 3 is a cross-sectional diagram of an LED pixel, illustrating the effect of sidewalls.

FIG. 3 is a cross-sectional diagram of an LED pixel, illustrating the effect of sidewalls. The tuning of the half-cavity distance may be combined with the sidewall and/or reflector shaping to enhance the control of the directionality and increase coupling efficiency to the projection optics. It may also reduce the complexity of the fabrication process. For most of the examples shown, the pixels are assumed to be circular. They may be arranged in a square or hexagonal grid. A cross-sectional view of a possible arrangement in square grid is shown in FIG. 3. The sloped sidewall is an excellent reflector when the dielectric has lower refractive index than that of the semiconductor, and when the emitted rays strike the sidewall beyond the critical angle.

Consider a case where the projection optics collects only light that is within 10° from normal (in the encapsulation material), with the rest being stray light. The numerical aperture (NA) of the optics is then $n_{encap} \cdot \sin 10°$, where $n_{encap}$ is the refractive index of the encapsulation material. The half-cavity height and the sidewall slope are selected to increase the amount of light collected by this collection cone. If the half-cavity thickness is around $0.78\lambda$, then there are two emission lobes (see FIG. 2B), with maximum powers at approximately 35° and 74°.

In one design, the sidewall angle $\theta_{SW}$ is approximately 17.5°, which is half of the angle of maximum power for the first lobe, which is approximately 35°. This design redirects the first lobe to the normal direction.

In an alternative design, the sidewall angle $\theta_{SW}$ is approximately 37°, which is half of the angle of maximum power for the second lobe, which is approximately 74°. This design also generates a single lobe (the second lobe) along the normal direction.

As shown in FIG. 3, assume that the lobe of interest has an angle of maximum power of $\theta_{emission}$ and the sidewall is sloped at angle $\theta_{emission}/2$ to reflect this lobe to normal. The minimum sidewall height $h_{SW}$ required to reflect all rays from the active region may be determined by the geometry of FIG. 3 as:

$$h_{SW} = \frac{1}{\tan(\theta_{emission}) + \tan(\theta_{emission}/2)} \times \text{pitch} \quad (1)$$

The width of the active region $W_{QW}$ is given by $$w_{QW} = \frac{\tan(\theta_{emission}) - \tan(\theta_{emission}/2)}{\tan(\theta_{emission}) + \tan(\theta_{emission}/2)} \times \text{pitch} \quad (2)$$

Figure 4:
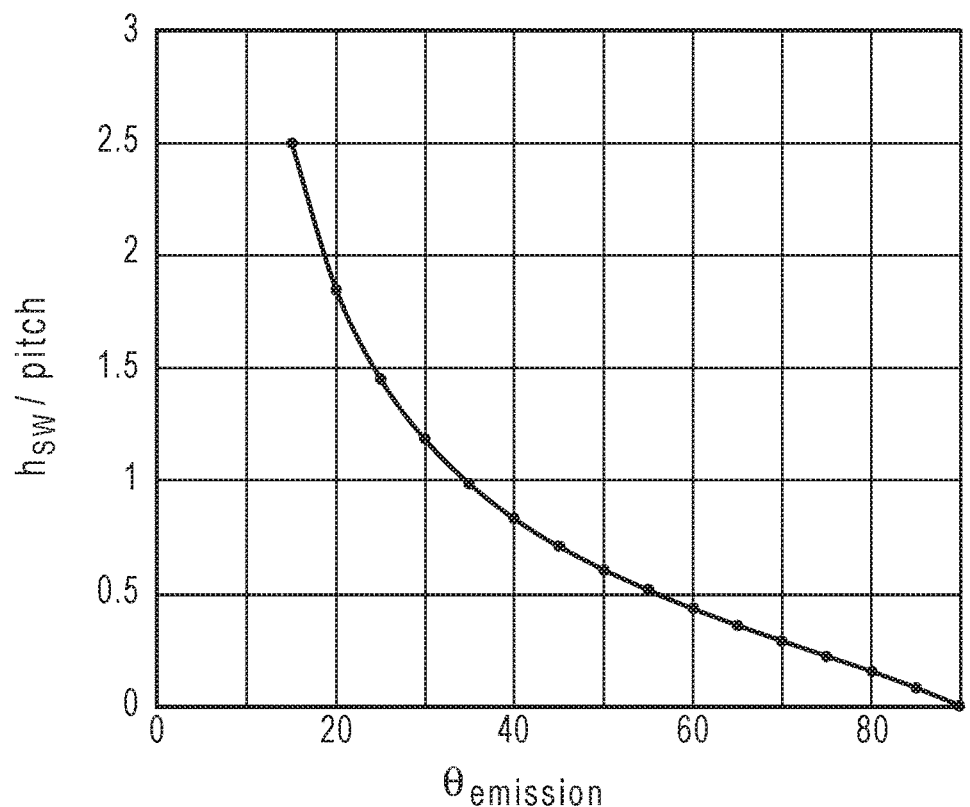
FIG. 4 is a plot of sidewall height as a function of emission angle.
Figure 5:
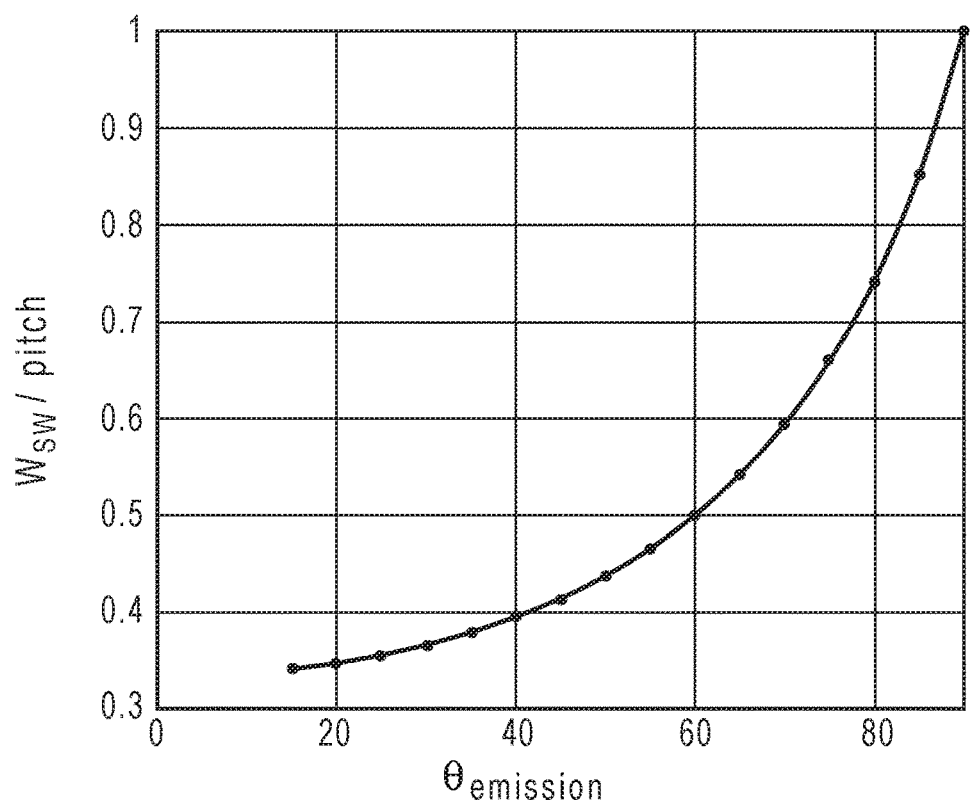
FIG. 5 is a plot of active region width as a function of emission angle.

FIG. 4 is a plot of this sidewall height normalized by the pixel pitch ($h_{SW}$/pitch) as a function of emission angle $\theta_{emission}$. FIG. 5 is a plot of the active region width normalized by the pixel pitch ($w_{QW}$/pitch) as a function of emission angle $\theta_{emission}$. The sloped sidewall reduces the width of the active region, so there is tradeoff between these two. Reducing the sidewall height below the height of Eqn. 1 means that some rays are not intercepted and redirected to normal. However, reducing the size of the active region means higher current density as well as more sidewall perimeter relative to the active area, both of which may be detrimental to quantum efficiency and reliability.

Figure 6:
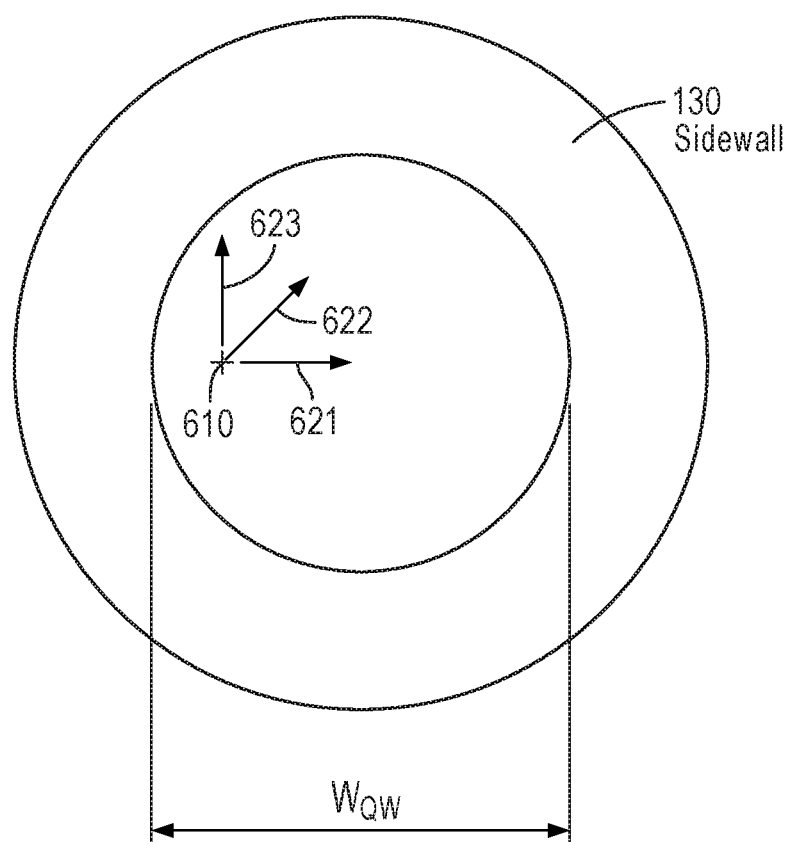
FIG. 6 is a plan view of an LED, illustrating the effect of skew rays.

The analysis above is a simplification true for rays traveling along the diameter of the pixel. In reality, the emission is the same in all azimuth directions, and most of the emission does not happen to be along a diameter. FIG. 6 is a plan view of an LED, illustrating the effect of these skew rays. Assume that the light from point 610 is emitted according to a power distribution that has a first lobe at 20°. Ray 621 is emitted at 20° and travels along a diameter of the circular pixel. It is described by the geometry shown in FIG. 3. Rays 622 and 623 are also emitted at 20°, but they do not follow the geometry of FIG. 3 because they are obliquely incident on the sidewalls. Considering all possible azimuth directions, the optimal sidewall angle is still close to half of the emission angle, and the minimum height calculation is still correct, but the collection efficiency drops as the emission angle increases.

Figure 7:
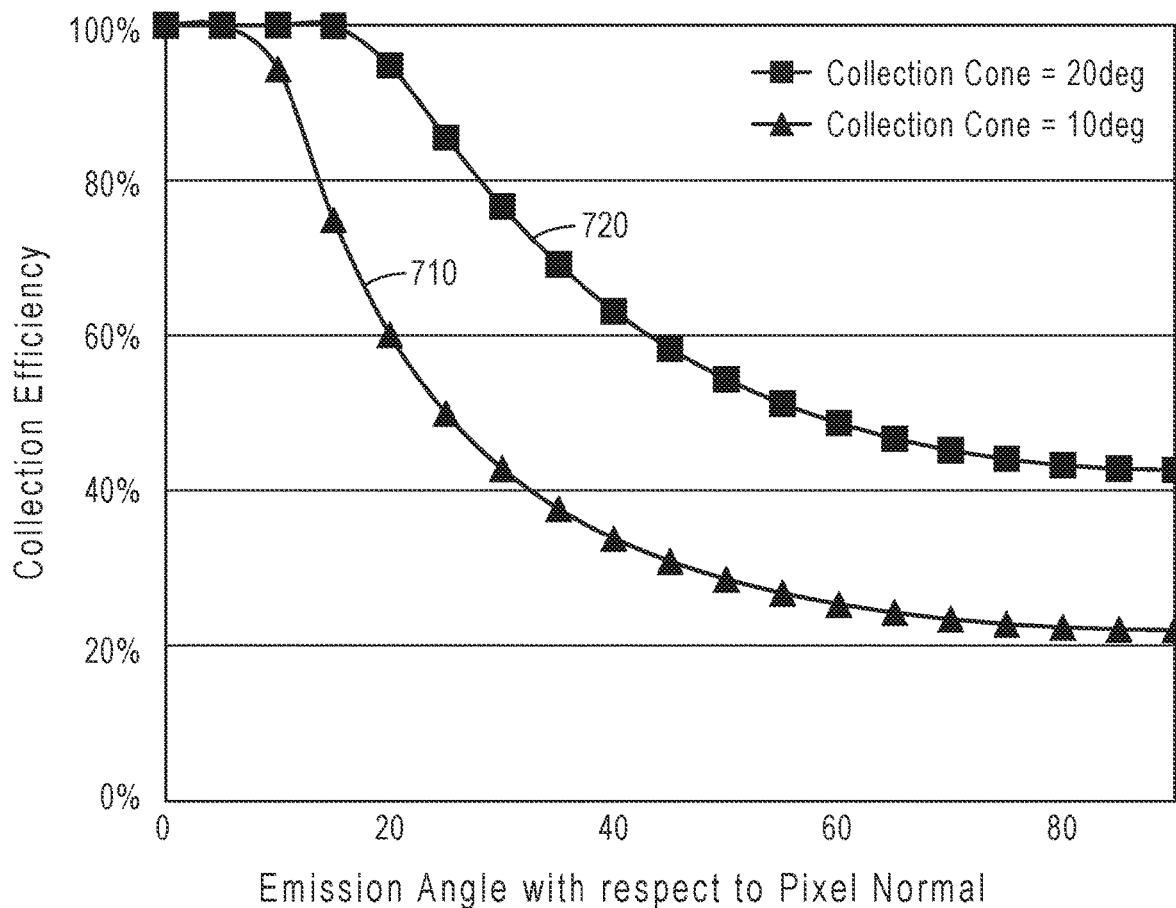
FIG. 7 is a plot of collection efficiency as a function of emission angle.

FIG. 7 is a plot of collection efficiency as a function of emission angle. For these plots, it is assumed that the quantum well stack has uniform emission across the entire surface and the emission everywhere is along a single direction with respect to the normal direction. That is, if the emission angle is 30° then all rays are emitted at an angle of 30° but in all azimuth directions. The sidewall would then be sloped at approximately 15°. FIG. 7 shows the collection efficiency, which drop from 100% due to the larger effect of skew rays at larger emission angles. Curve 710 shows the collection efficiency for a 10° collection cone and curve 720 shows the collection efficiency for a 20° collection cone.

Figure 8:
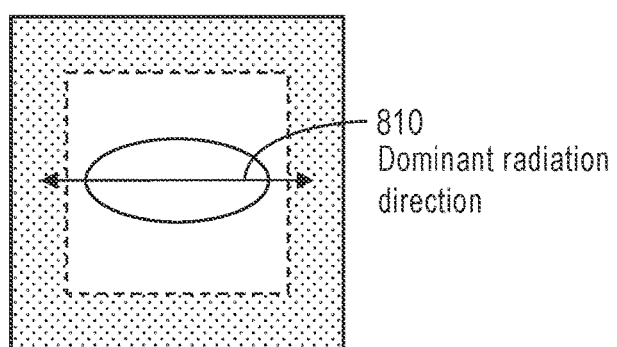
FIG. 8 is a plan view of an LED with asymmetric power distribution.

Some embodiments are designed to reduce the azimuthal symmetry of the emission. FIG. 8 is a plan view of an LED with asymmetric power distribution. In this example, the pixel has a dominant emission direction 810, meaning that more power is emitted along this direction compared to the traverse direction. In addition, square or rectangular pixels are used instead of the round ones, with two of the straight sidewalls running perpendicular to the dominant emission direction. Epitaxy structures that are known to have anisotropic spontaneous emission include semiconductor quantum wells grown on crystal with large offcut, such as nonpolar or semi-polar GaN, or various quantum wire structures.

It may be desirable to suppress the emission in directions outside the collection cone of the projection optics to prevent these rays from rescattering back into the collection cone accidentally as stray light. The encapsulation layer, having a lower refractive index than the semiconductor (i.e. LED) typically, can provide to some extent this function as rays outside the critical angle of the semiconductor-encapsulation interface are trapped in the semiconductor.

Figure 9:
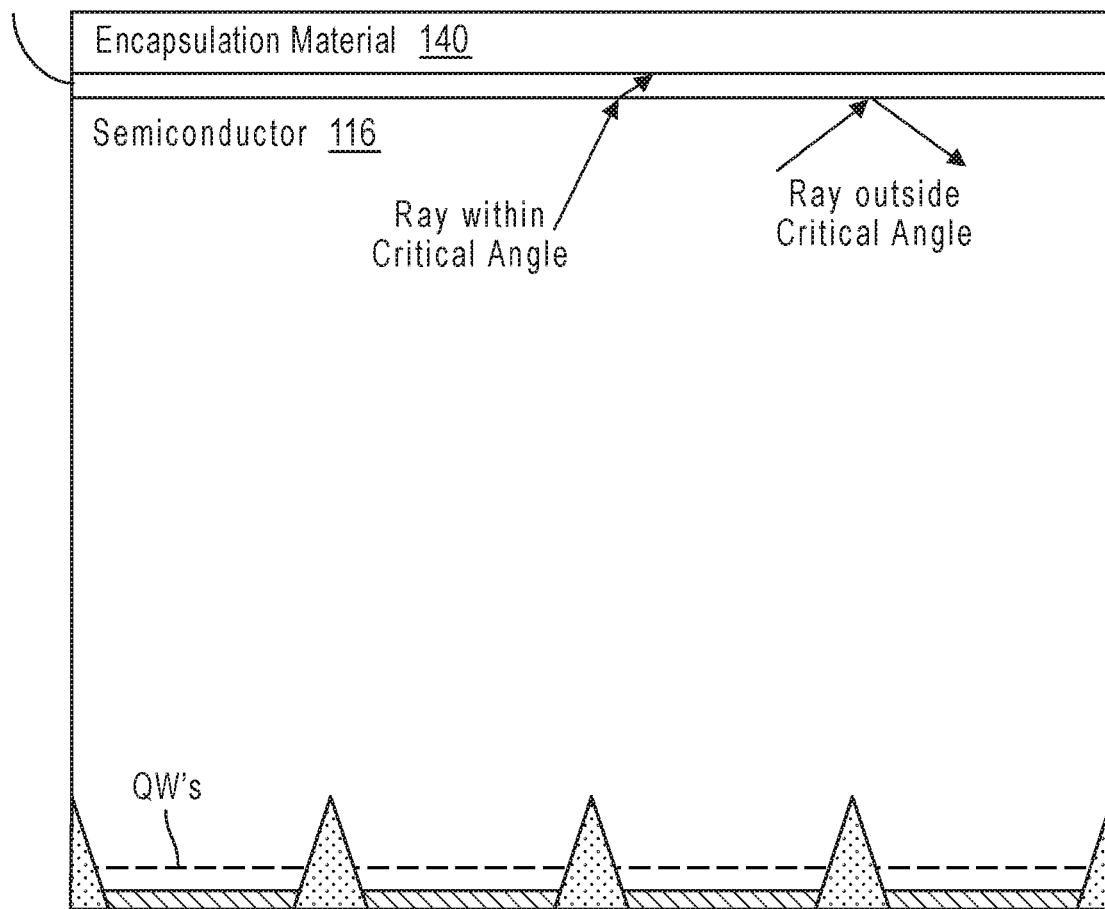
FIG. 9 is a cross-sectional diagram of an LED array with a low index layer.

If more control is desired, a thin "low-index layer" may be used. FIG. 9 is a cross-sectional diagram of an LED array with a low index layer 910. The low index layer 910 is positioned on top of the LED layer 116, and has an even lower refractive index than both the semiconductor 116 and the encapsulation material 140. For example, it may be an air gap. Its refractive index may be chosen such that the critical angle between it and the semiconductor approximately matches the collection cone of the projection optics inside the semiconductor material.

The combination of half-cavity effect and sloped sidewalls provides another means to suppressed unwanted emission. Looking at the case when the half-cavity thickness is around 0.8λ and the sidewall angle is 17.5°, the first lobe at 35° is rotated to approximately normal, while the second lobe around the 74° is rotated to 39°. This second lobe can be blocked if the encapsulation material has index less than 1.51. This can be accomplished by common dielectric materials such as $SiO_2$. Additional suppression may be accomplished again by an additional "low index layer."

Figure 10:
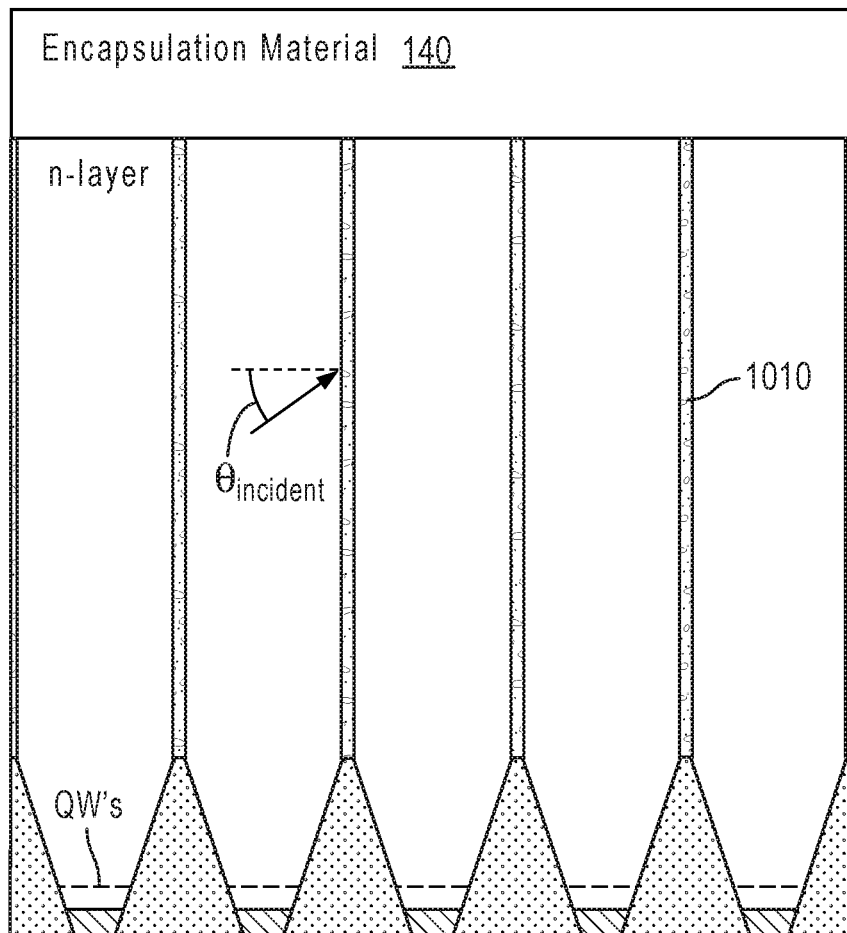
FIG. 10 is a cross-sectional diagram of an LED array with absorptive borders.

FIG. 10 is a cross-sectional diagram of an LED array with absorptive borders between adjacent LEDs. Here, deep, vertical trenches 1010 are created between LED pixels and filled with absorptive metal such as chromium or tungsten. The reflectivity is high even for very absorptive metals when the angle of incidence $\theta_{incidence}$ is higher (i.e., more oblique). For rays that are redirected by the half cavity and the sloped sidewalls to near normal, the reflection will be high. Other rays will experience higher absorption by the vertical absorptive metal and can be suppressed effectively after a few bounces.

Figure 11:
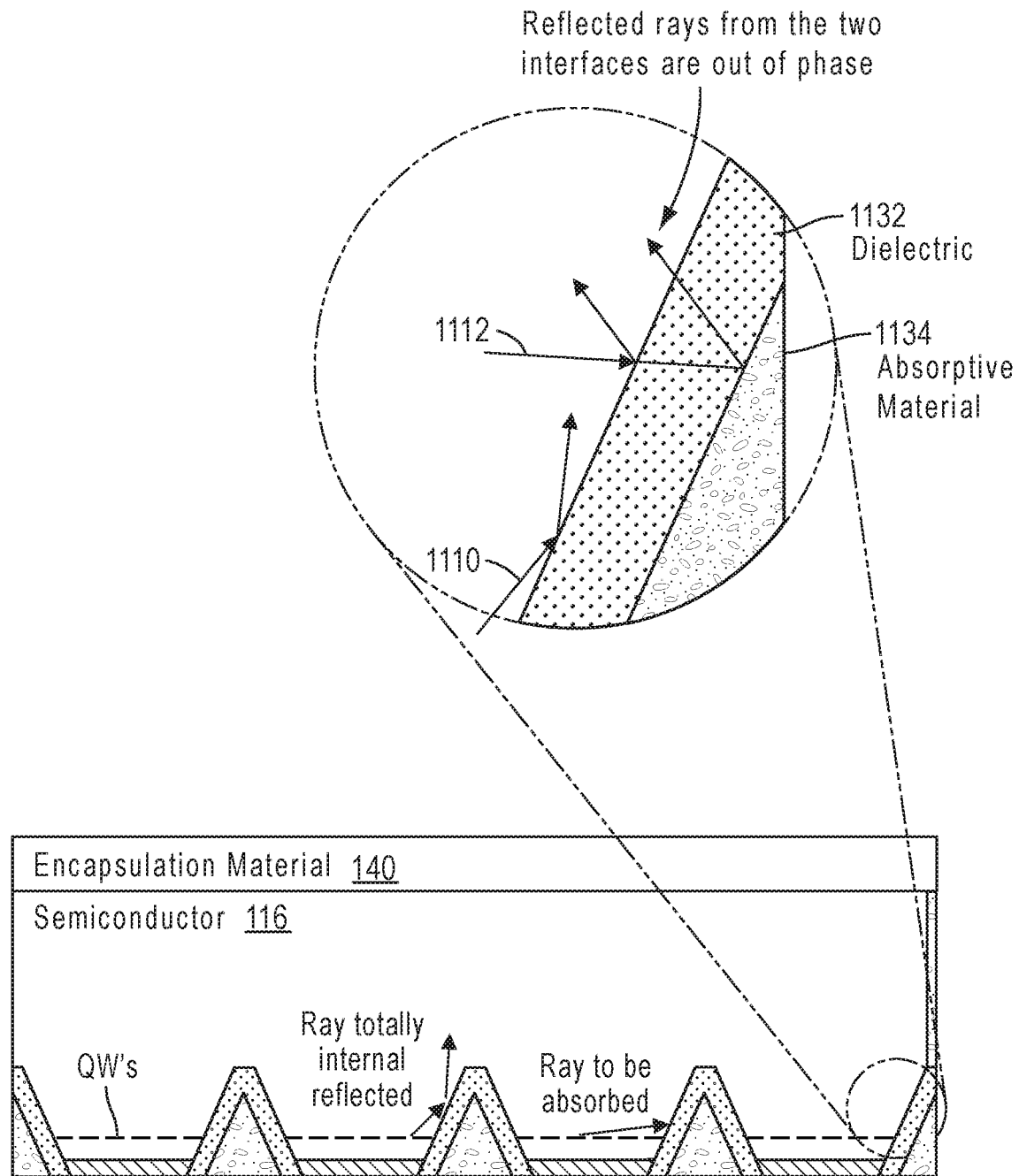
FIG. 11 is a cross-sectional diagram of an LED array with dielectric sidewalls.

Another approach is to utilize the sidewall surface directly. FIG. 11 is a cross-sectional diagram of an LED array with dielectric 1132 sidewalls. FIG. 11 includes a magnified section of the sidewall. An absorptive material 1134 may be introduced into the region between the dielectric 1132 sidewalls. The refractive index of the dielectric 1132 is chosen such that the desired lobe (e.g., the first lobe in FIG. 2B) is total-internal-reflected, such as ray 1110. Rays 1112 from other lobes pass through the dielectric layer 1132 and are absorbed by the absorptive structure 1134 behind it. The absorption can be further enhanced if the thickness of the dielectric is such that the round-trip phase change in the dielectric layer satisfies the anti-reflection condition, as shown in the close-up of FIG. 11. In another version, the dielectric between the sloped sidewalls and the absorber is replaced by a multilayer dielectric structure, designed such that only rays propagating along the normal direction are well reflected, while the rays in other directions are directed towards the absorber.

FIGS. 12-14 show different fabrication processes. FIGS. 12-13 show two different fabrication processes for forming the sidewall trench between LEDs. FIG. 14 shows a fabrication process for attaching contacts to the LEDs. In FIGS. 12-14, the substrates are upside down compared to FIGS. 1-11. That is, the reflector is at the top of the stack and the thicker n-layer is at the bottom of the stack in FIGS. 12-14. As a result, the directions in FIGS. 12-14 are also reversed relative to FIGS. 1-11.

Figure 12A:
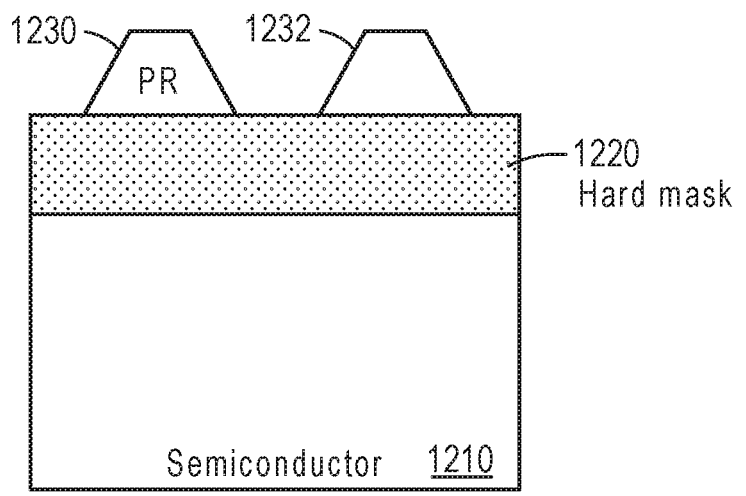
FIGS. 12A-12C are cross-sectional diagrams illustrating etching of a trench between LEDs.
Figure 12B:
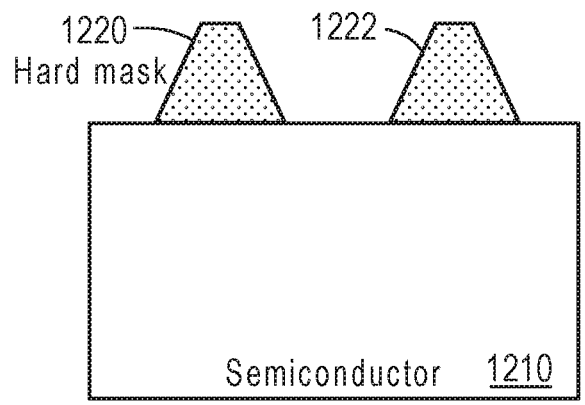
Figure 12C:
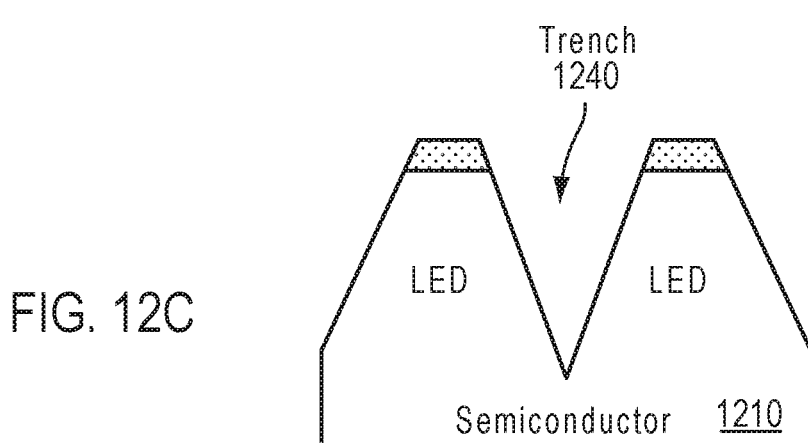

FIGS. 12A-12C are cross-sectional diagrams illustrating etching of a trench between LEDs. In these figures, the semiconductor wafer 1210 is partially processed. Although not shown in FIG. 12, the semiconductor wafer 1210 includes, from bottom to top, the thicker n-layer 116, active region 114, thinner p-layer 112, and the reflector layer 120, where the reference numbers refer to these layers as shown in FIG. 1. In FIG. 12, the sidewall trench is etched into these layers.

In FIG. 12A, a hard mask 1220 is deposited on the wafer and a softer photoresist layer 1230 is deposited on top of that. The photoresist 1230 is shaped to have a sloped surface 1232. This can be done by gray scale exposure that causes the photoresist 1230 to be developed to different degrees at different positions. This can be utilized to form a sloped sidewall 1232 at the edges of the photoresist structures. Another approach is to remelt the photoresist 1230 after development. Each piece of photoresist forms a droplet shape with sloped sides 1232 and retains the sloped sides when it solidifies.

The shaped photoresist profile is then transferred into the semiconductor wafer 1210. In some cases, the shaped photoresist structure may be used as a dry etching mask to directly transfer the shape into the semiconductor wafer 1210, if the semiconductor can be etched with moderate power that does not destroy the photoresist structure 1230 quickly.

As shown in FIG. 12B, for semiconductors like GaN that are dry etched with higher power, the shaped photoresist 1230 may be first transferred into an intermediate hard mask 1220, with hardness between that of the photoresist and the hard semiconductor material. FIG. 12B shows the sloped sidewalls 1222 transferred into the hard mask 1220. The sloped sidewalls are then transferred from the hard mask into the semiconductor, forming trenches 1240 between the LEDs as shown in FIG. 12C.

Figure 13A:
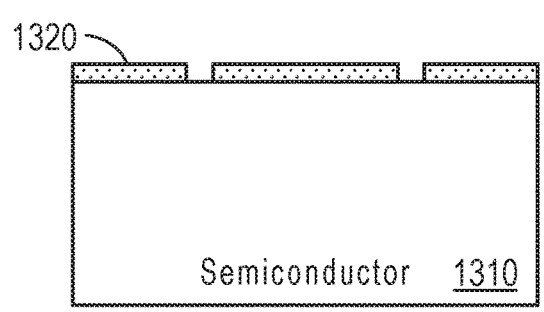
FIGS. 13A-13E are cross-sectional diagrams illustrating growing LEDs separated by intervening trenches.
Figure 13B:
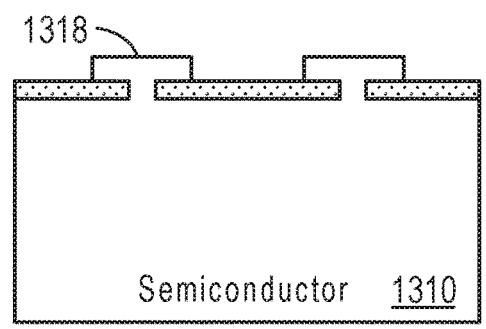
Figure 13C:
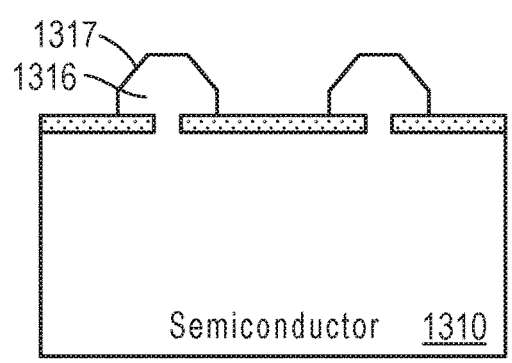
Figure 13D:
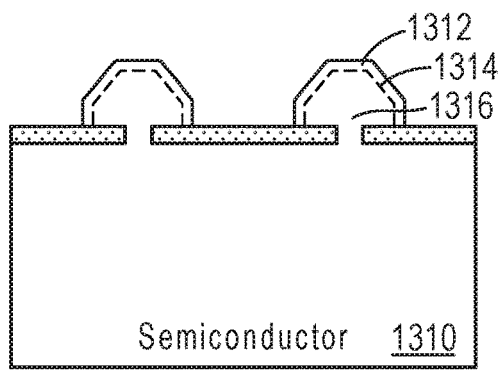
Figure 13E:
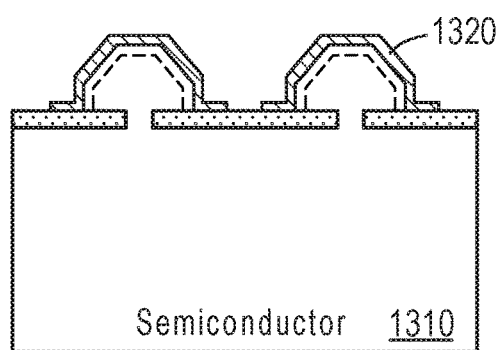

A different approach is to grow the shaped structure epitaxially. FIGS. 13A-13E are cross-sectional diagrams illustrating growing LEDs separated by intervening trenches. In FIG. 12, the trenches between LEDs are formed by removing material between LEDs. In FIG. 13, the trenches are formed by growing the LEDs with trenches between them. In this realization, a growth mask 1320 in the form of a thin dielectric such as $Al_2O_3$ or $Si_3N_4$ or $SiO_2$ is first deposited on semiconductor wafer 1310, as shown in FIG. 13A. Here, the semiconductor wafer 1310 is a substrate that contains the thicker n-layer 116 of FIG. 1, but does not yet have the active region or p-layer of FIG. 1. Short pedestals 1318 are grown first, as shown in FIG. 13B. This is followed by a change in growth mode such that different crystallographic faces are favored. In doing so, sloped faces 1317 are formed at the edges of the pixels, as shown in FIG. 13C. These sloped faces will eventually lead to the sloped sidewalls. The pixel 1316 itself is n-doped at this point. This is then followed by the growth of the quantum wells 1314 and the thin p-layer 1312, as shown in FIG. 13D. Finally, a reflective metal layer 1320 is then formed by lift-off or etching to surround each of the LEDs, as shown in FIG. 13E.

Figure 14A:
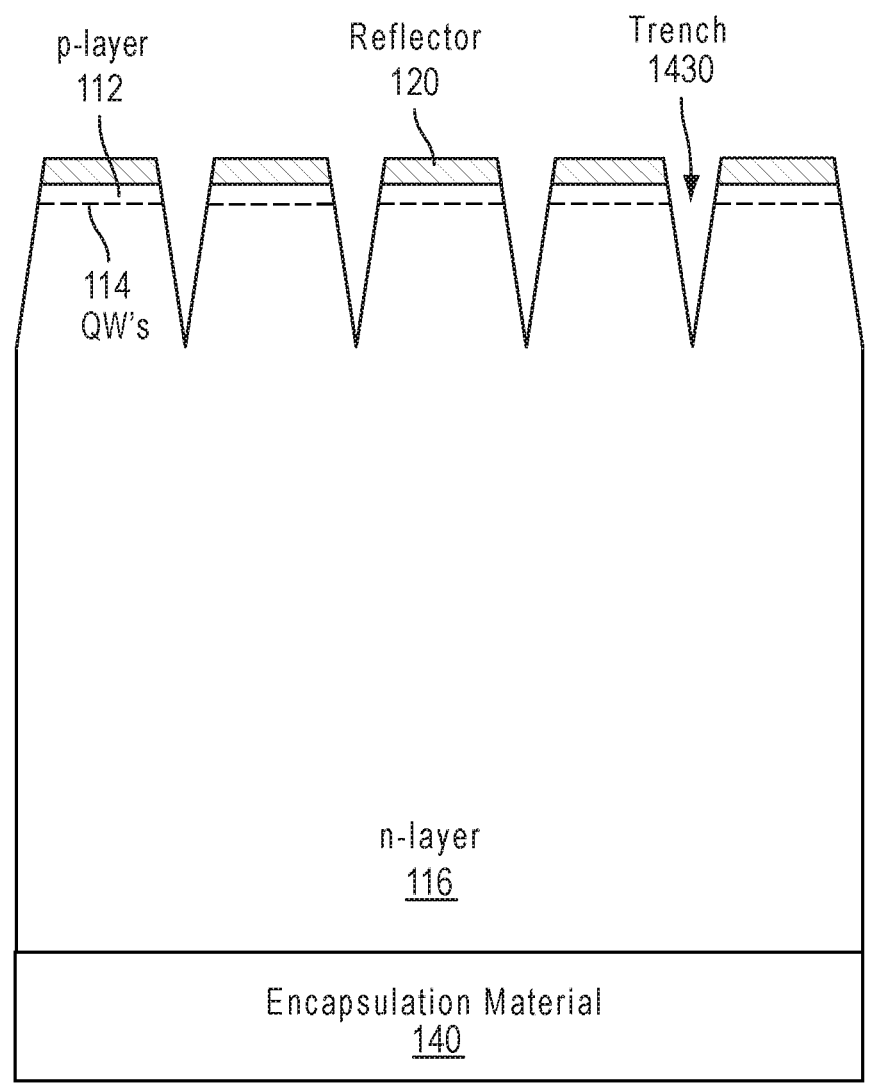
FIGS. 14A-14F are cross-sectional diagrams illustrating a process for forming metal contacts for an LED array.
Figure 14B:
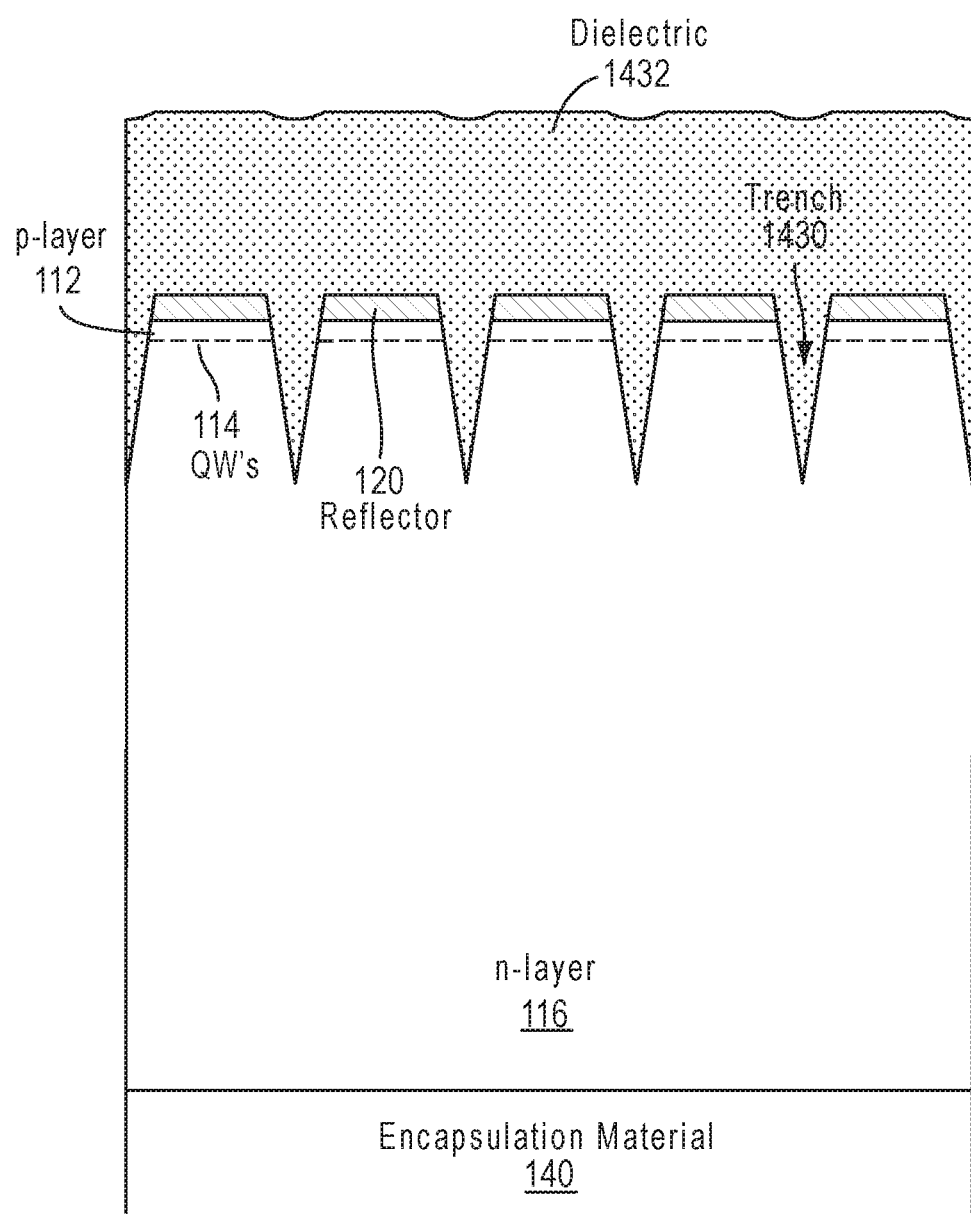

FIGS. 12 and 13 shows two different processes for creating trenches between LEDs. FIGS. 14A-14F are cross-sectional diagrams illustrating a process for forming metal contacts for these LEDs. FIG. 14A starts at the ending point of FIG. 12 and/or FIG. 13. At this point of the processing, the wafer has the basic LED stack: reflector 120, thinner p-layer 112, quantum well active region 114, and thicker n-layer 116. Adjacent LEDs are separated by trenches 1430, which could be formed using the approach of either FIG. 12 or 13. In FIG. 14B, dielectric 1432 is deposited on the wafer, filling the trenches 1430. Alternatively, a dielectric 1432 may partially fill the trenches, with an absorptive material deposited after the dielectric. Examples of dielectric 1432 include $SiO_2$, $Si_3N_4$, $Al_2O_3$, benzocyclobutene (BCB), spin-on glass, and polyimide. Because of the high aspect ratios involved, the top surface of the dielectric may exhibit some topology.

Figure 14C:
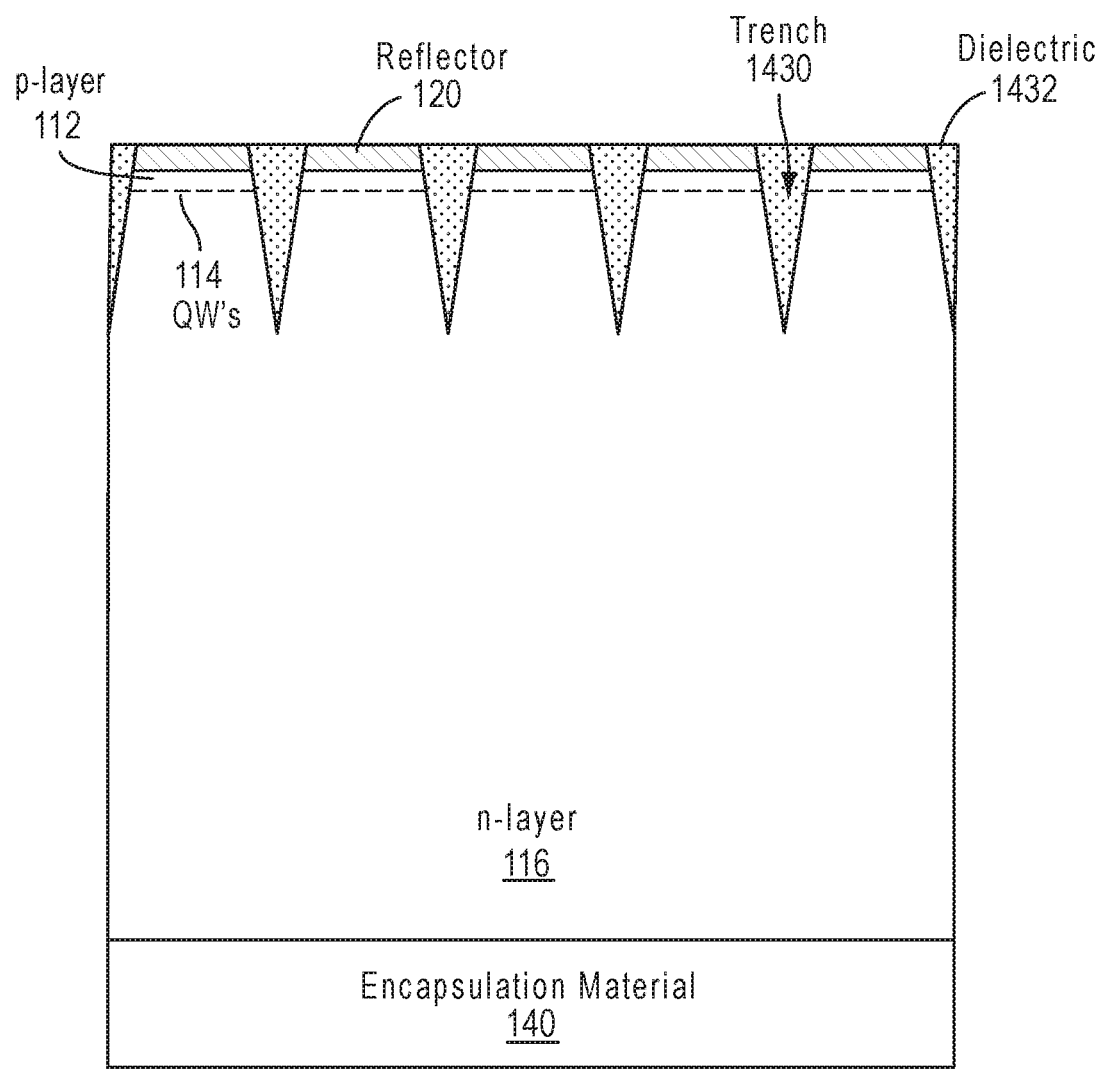

In FIG. 14C, the top surface is planarized, for example by chemical mechanical polishing. This forms a flat surface with both the reflector layer 120 and adjacent dielectric 1432. In some cases, the surface flatness is 200 nm or better.

In alternative approach, the planarized surface may be produced by depositing BCB in FIG. 14B and then etching back with a dry etch.

Figure 14D:
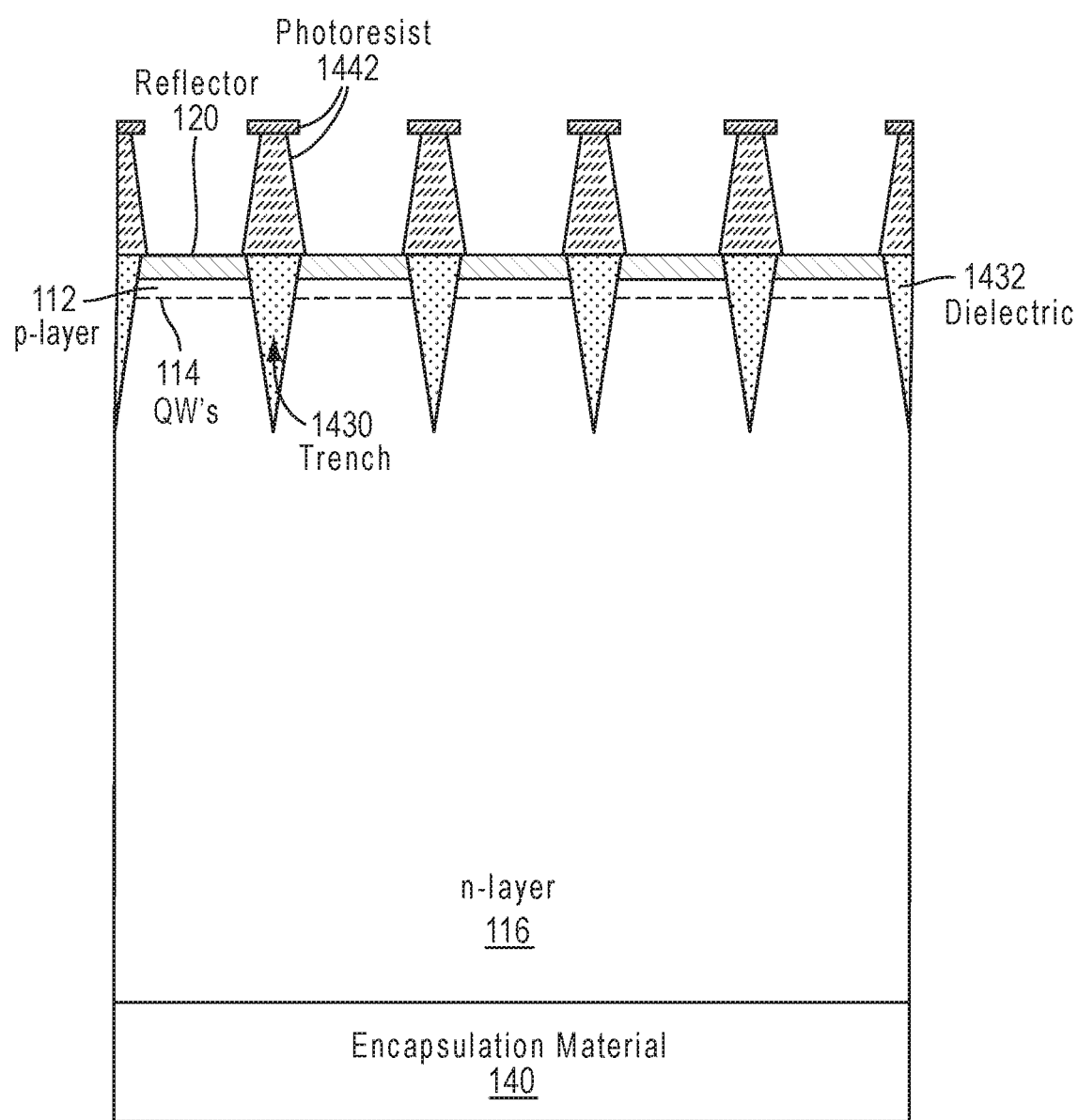
Figure 14E:
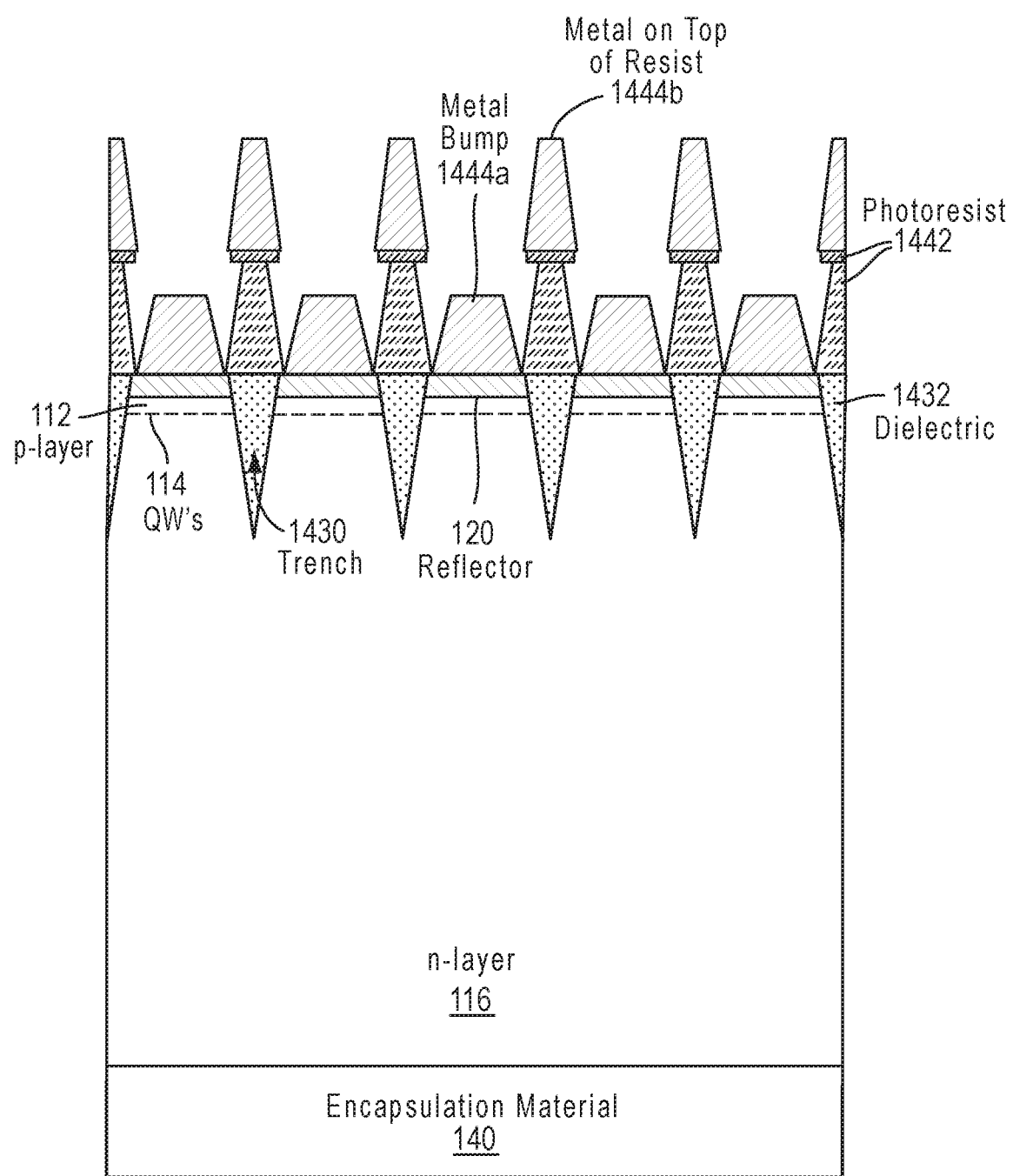
Figure 14F:
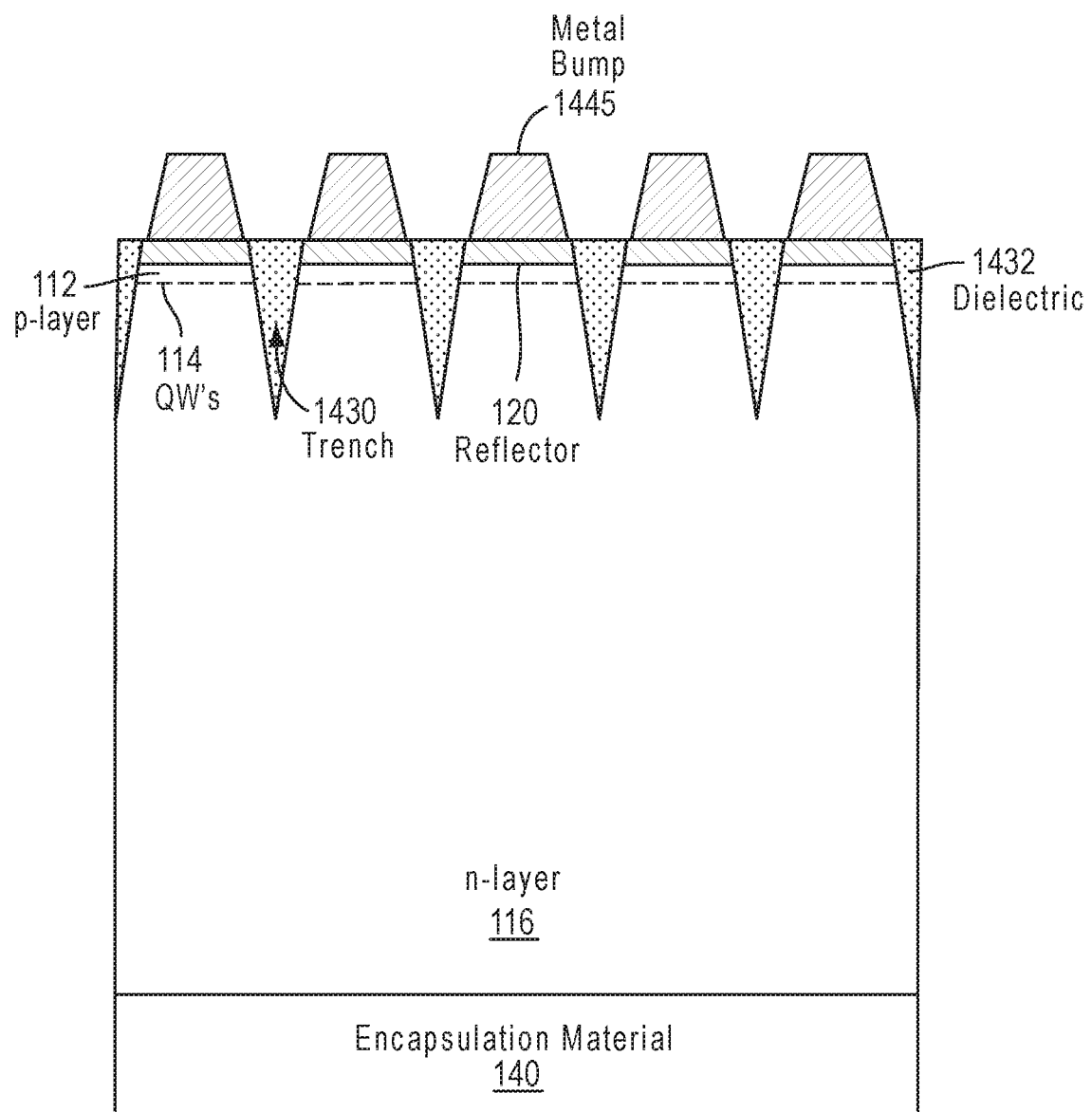

In FIGS. 14D-14F, metal contacts to the reflector layer 120 are formed. Because these LED pixels are so small, it can be difficult to form metal contacts on the reflector layer 120 alone, if the adjacent flat dielectric 1432 were not also present.

In FIGS. 14D-14F, the metal contacts are formed using a liftoff process. In FIG. 14D, photoresist 1442 is deposited on the flat surface and then patterned. The dielectric 1432 is covered by photoresist 1442, but the reflector layer 120 is exposed. In FIG. 14D, a two-layer photoresist 1442 is used. In FIG. 14E, a metal layer 1444 is deposited on the structure. The metal layer 1444a deposited on the reflectors 120 will become the metal contacts to the LEDs. The metal layer 1444B deposited on the photoresist 1442 will be removed by liftoff. The resulting metal contacts 1445 are shown in FIG. 14F. An alternative to the liftoff process is metal deposition by electroplating, followed by a metal etch.

Planarizing the reflector 120 and dielectric 1432 together creates a larger flat surface on which to deposit the photoresist 1442 and metal 1444 structures. For example, in FIG. 14D, the photoresist ridges 1442 are supported by the dielectric 1432 and reflector 120. The ridges are tall and skinny (high aspect ratio) and would be difficult to create over topography. Planarizing the dielectric 1432 and reflector 120 creates a flat surface for these high aspect ratio features. The same is true for the metal deposition and liftoff. For example, the photoresist ridges 1442 may have a width of between 0.1 um to 0.5 um and a height of 1 um to 2 um. The metal contacts 1444a may have a width of between 0.4 um to 2 um and a height of 1 um to 2 um. The aspect ratios (height:width) of these features may be 2:1 or higher.

Figure 15:
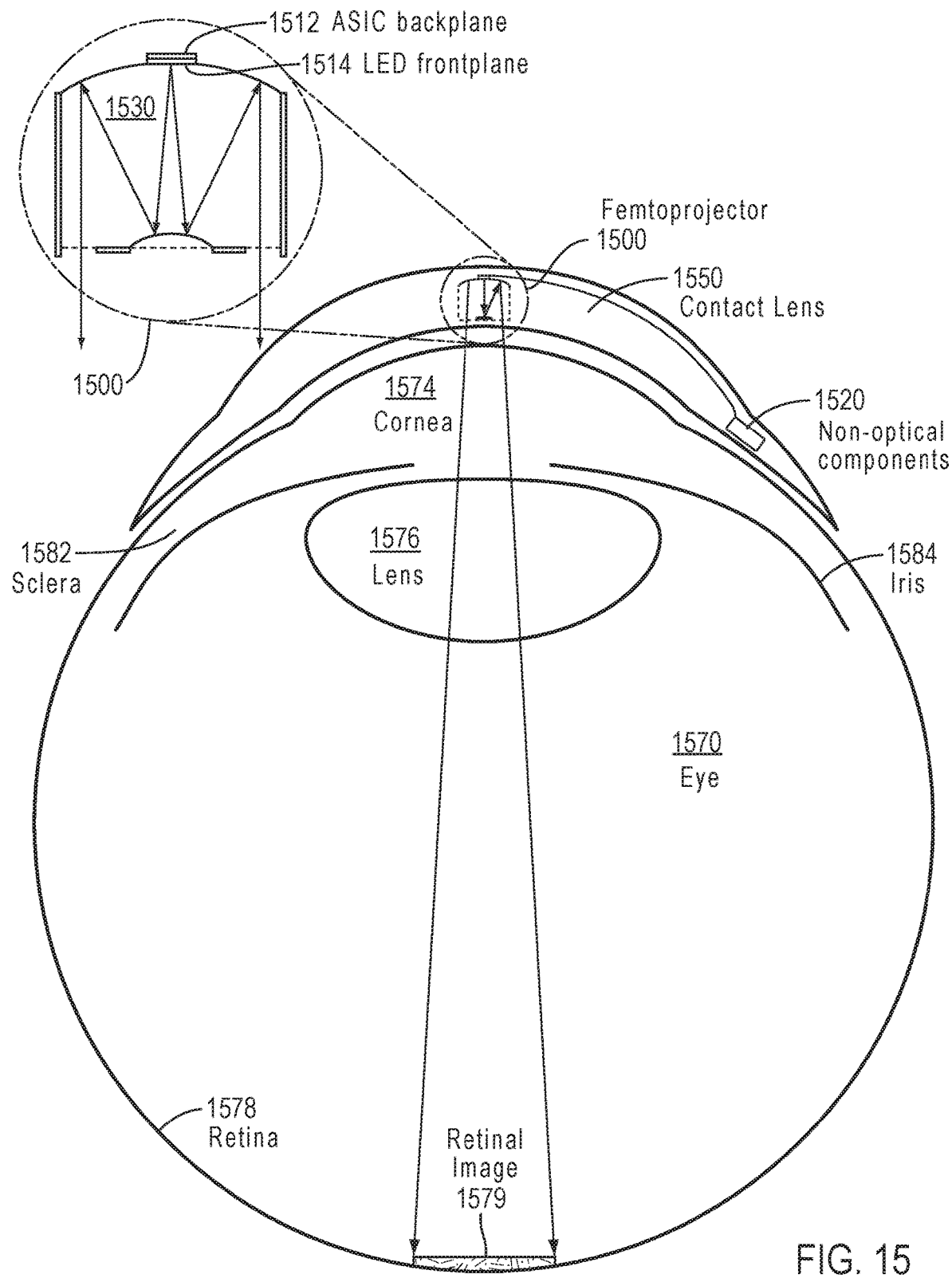
FIG. 15 shows a cross sectional view of an eye-mounted display containing a femtoprojector in a contact lens.

One possible use of a monolithic ultra-dense LED array as described above is as the image source in a contact lens-based display so that the displayed image overlays (or replaces) the wearer's view of the real world. FIG. 15 shows a cross sectional view of an eye-mounted display containing a femtoprojector 1500 in a contact lens 1550.

FIG. 15 shows an embodiment using a scleral contact lens which may be designed so that it does not move relative to the eyeball, but the contact lens does not have to be scleral. The aqueous of the eyeball is located between the cornea 1574 and the crystalline lens 1576 of the eye. The vitreous fills most of the eyeball including the volume between the crystalline lens 1576 and the retina 1578. The iris 1584 limits the aperture of the eye.

The contact lens 1550 preferably has a thickness that is less than two mm, and the femtoprojector 1500 preferably fits in a 2 mm by 2 mm by 2 mm or smaller volume. The contact lens 1550 is comfortable to wear and maintains eye health by permitting oxygen to reach the cornea 1574. The femtoprojector 1500 includes an image source 1512/1514 and projection optics 1530. The image source includes a backplane 1512 and a frontplane 1514, examples of which have been described above. In this example, the backplane 1512 is a CMOS application specific integrated circuit (ASIC) and the frontplane 1514 includes a GaN LED array. The backplane electronics 1512 receive data packets from a source external to the eye-mounted display. The backplane ASIC 1512 converts the data packets to drive currents for the frontplane GaN LED array 1514, which produces light that is projected by the optical system 1530 to the user's retina 1578.

In some designs, the optical system 1530 is a two mirror system. For example, see U.S. patent application Ser. No. 16/034,761, "Advanced Optical Designs for Eye-Mounted imaging Systems," (40785); and U.S. Pat. No. 10,353,204, "Femtoprojector Optical Systems," (37915); which are all incorporated by reference in their entireties. These optical systems 1530 are small enough to fit into a contact lens and may be small enough to fit into a 2 mm×2 mm×2 mm volume, or even into a 1 mm×1 mm×1 mm volume. These designs may have a collection angle of 10 degrees to 40 degrees (5 to 20 degrees half angle), as measured in air. The collection angle will be reduced correspondingly, if measured in a medium with a higher refractive index.

The array of light emitters 1514 may have non-uniform resolution. For example, the central area of the array may be imaged onto the fovea and therefore the center pixels have higher resolution (i.e., smaller pitch between pixels) compared to pixels on the periphery of the array. The pitches of the frontplane 1512 and backplane 1514 may be matched, in which case there is less area for each pixel driver in the center of the backplane compared to the periphery. Alternately, the backplane 1514 may have a uniform pitch, where the frontplane 1512 still has a variable pitch. In one approach, a wiring layer bridges between the uniform pitch backplane 1514 and variable pitch frontplane 1512. By using different wiring layers, the same backplane may be used with different frontplanes.

Eye-mounted femtoprojector displays may use a 200×200 array of color pixels. The display may be monochromatic or color. A three-color display with three LEDs per color pixel may have a total of at least 120,000 LEDs.

Another possible use of the monolithic ultra-dense LED display is in eyewear, such as glasses or goggles, to create an immersive visual experience or an image that overlays the wearer's view of the real world, such as in an augmented, mixed, or artificial reality application.

Although the detailed description contains many specifics, these should not be construed as limiting the scope of the invention but merely as illustrating different examples. It should be appreciated that the scope of the disclosure includes other embodiments not discussed in detail above. For example, the principles described above may also be applied to LED arrays in which the roles of the n- and p-layers are reversed. Various other modifications, changes and variations which will be apparent to those skilled in the art may be made in the arrangement, operation and details of the method and apparatus disclosed herein without departing from the spirit and scope as defined in the appended claims. Therefore, the scope of the invention should be determined by the appended claims and their legal equivalents.

What is claimed is:

1. A method for manufacturing an array of semiconductor LEDs, the method comprising:
   at least partially filling trenches in a partially processed wafer with a dielectric; wherein:
      the partially processed wafer comprises, in order from bottom to top: a bottom layer that is one of an n-layer and a p-layer, an active region, a top layer that is the other of an n-layer and a p-layer, and a reflector layer;
      the trenches extend through the reflector layer, the top layer, the active region and into the bottom layer;
      the trenches isolate active regions of adjacent individual LEDs; and
      the dielectric-filled trenches form straight sidewalls extending at an angle from the active region downwards and adjacent to the bottom layer;
   planarizing the wafer to produce a top surface comprising the planarized dielectric and reflector layer, wherein the top surface forms a flat surface for forming metal contacts to each of the LEDs; and after planarizing the wafer, forming metal contacts to the reflector layer, the metal contacts formed on the top surface produced by the planarization.

2. The method of claim 1 wherein planarizing the wafer comprises using chemical mechanical polishing to planarize the wafer.

3. The method of claim 1 wherein the dielectric is benzocyclobutene and planarizing the wafer comprises dry etching the benzocyclobutene.

4. A method for manufacturing an array of semiconductor LEDs, the method comprising:
at least partially filling trenches in a partially processed wafer with a dielectric; wherein:
the partially processed wafer comprises, in order from bottom to top: a bottom layer that is one of an n-layer and a p-layer, an active region, a top layer that is the other of an n-layer and a p-layer, and a reflector layer;
the trenches extend through the reflector layer, the top layer, the active region and into the bottom layer;
the trenches isolate active regions of adjacent individual LEDs; and
the dielectric-filled trenches form straight sidewalls extending at an angle from the active region downwards and adjacent to the bottom layer;
planarizing the wafer to produce a top surface comprising the planarized dielectric and reflector layer; wherein the top surface forms a flat surface for forming metal contacts to each of the LEDs, the wafer has a topography of at least 1 um before planarization, and the topography is reduced to less than 0.2 um by the planarization; and
forming metal contacts to the reflector layer.

5. The method of claim 1 wherein forming the metal contacts comprises using an electroplating process to form the metal contacts.

6. The method of claim 1 wherein forming the metal contacts comprises using a liftoff process to form the metal contacts.

7. The method of claim 1 wherein forming the metal contacts comprises:
depositing and patterning a photoresist layer over the flat surface, wherein the top surface of the dielectric is covered by photoresist and the top surface of the reflector layer is exposed;
depositing a metal layer over the patterned photoresist, the metal layer contacting exposed areas of the reflector layer; and
lifting off the photoresist, thereby lifting off the metal layer in areas between the exposed areas of the reflector layer.

8. The method of claim 7 wherein the photoresist covering the dielectric has an aspect ratio of height compared to width of not less than 2:1.

9. The method of claim 7 wherein the photoresist covering the dielectric has a width of not more than 1 um.

10. The method of claim 1 wherein the metal contacts are metal bumps with an aspect ratio of height compared to width of not less than 1:2.

11. The method of claim 1 wherein the partially processed wafer is formed by:
creating a wafer with the bottom layer, the active region, the top layer, and the reflector layer; and
etching the trenches through the reflector layer, the top layer, the active region and into the bottom layer.

12. The method of claim 11 wherein etching the trenches comprises:
forming a shaped photoresist profile on a top surface of the wafer; and
transferring the shape profile from the photoresist into the wafer by dry etching, thereby creating the trenches.

13. The method of claim 12 wherein the shape profile is transferred from the photoresist into the wafer using an intermediate hard mask.

14. The method of claim 1 wherein the partially processed wafer is formed by:
growing the bottom layer, the active region, the top layer, and the reflector layer on the wafer, wherein the layers are grown in a pattern that creates the trenches.

15. The method of claim 1 further comprising:
at least partially filling the trenches with an absorptive material after the dielectric.

16. The method of claim 1 wherein a pitch between the LEDs in the array is not greater than 3 um.

17. The method of claim 16 wherein the trenches have an aspect ratio of height of the trenches compared to a width of the trenches of not less than 1:1.

18. The method of claim 1 wherein the reflector and the top layer form a half cavity for light emitted from the active region, the half cavity redistributes light emitted from the active region into an angular power distribution with at least one lobe, and the straight sidewalls extend at an angle that reflects at least one of the lobes to a direction that is closer to normal to the active region than before the reflection.

19. The method of claim 18 wherein the sidewalls are reflective due to total internal reflection at an interface between the bottom layer and the dielectric.

20. The method of claim 1 wherein the active region comprises quantum wells.

* * * * *